(12) United States Patent
Jee

(10) Patent No.: US 7,777,860 B2
(45) Date of Patent: Aug. 17, 2010

(54) EXPOSURE APPARATUS FOR FLAT PANEL DISPLAY DEVICE AND METHOD OF EXPOSING USING THE SAME

(75) Inventor: Young-Seung Jee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 647 days.

(21) Appl. No.: 11/390,074

(22) Filed: Mar. 28, 2006

(65) Prior Publication Data

US 2006/0215090 A1    Sep. 28, 2006

(30) Foreign Application Priority Data

Mar. 28, 2005    (KR) .................... 10-2005-0025430

(51) Int. Cl.
G03B 27/42    (2006.01)
(52) U.S. Cl. .................................................. 355/53
(58) Field of Classification Search .................. 355/53, 355/30
See application file for complete search history.

(56) References Cited

U.S. PATENT DOCUMENTS

2003/0147150 A1* 8/2003 Kohl et al. ................. 359/727
2003/0156271 A1* 8/2003 Byun et al. ................... 355/75
2004/0239903 A1* 12/2004 Momose et al. .............. 355/53
2005/0264777 A1* 12/2005 Gardner et al. .............. 355/53

FOREIGN PATENT DOCUMENTS

| CN | 1573406 | 2/2005 |
| EP | 1 480 258 | 11/2004 |
| JP | 1160013 | 6/1989 |
| JP | 11195595 | 7/1999 |
| JP | 2001166494 | 6/2001 |

* cited by examiner

*Primary Examiner*—Edward J Glick
*Assistant Examiner*—Mesfin T Asfaw
(74) *Attorney, Agent, or Firm*—McKenna Long & Aldridge LLP

(57) ABSTRACT

An exposure apparatus for a flat panel display device includes: a light source; a stage having a horizontal support surface on which a substrate may be disposed; a mask vertically arranged with respect to the horizontal support surface; a frame surrounding an edge of the mask; and an optical system between the light source and the stage, the optical system controlling a direction of a light from the light source through the mask to irradiate the light onto the stage. The invention also includes a method for exposing including disposing a substrate on the stage, the substrate including a thin film and a photoresist layer on the thin film; and irradiating light from the light source through the mask and via the optical system onto a portion of the photoresist layer on the substrate.

13 Claims, 5 Drawing Sheets

EXPOSURE APPARATUS FOR FLAT PANEL DISPLAY DEVICE AND METHOD OF EXPOSING USING THE SAME

The present invention claims the benefit of Korean Patent Application No. 2005-0025430, filed in Korea on Mar. 28, 2005, which is hereby incorporated by reference for all purposes as if fully set forth herein.

BACKGROUND OF THE INVENTION

1. Field of the Invention

The present invention relates to an exposure apparatus, and more particularly, an exposure apparatus for a flat panel display (FPD) device and a method of exposing using the exposure apparatus.

2. Discussion of the Related Art

As the information age progresses, flat panel display (FPD) devices having light weight, thin profile, and low power consumption characteristics are being developed and are commonly substituted for cathode ray tube (CRT) devices. Generally, display devices may be classified according to their ability for self-emission as either emissive display devices or non-emissive display devices. Emissive display devices display images by taking advantage of their ability to self-emit light, while non-emissive display devices require a light source since they do not themselves emit light. For example, plasma display panel (PDP) devices, field emission display (FED) devices, and electroluminescent display (ELD) devices are commonly used emissive display devices. Liquid crystal display (LCD) devices may be categorized as non-emissive display devices and are commonly used in notebook and desktop computers because of their high resolution, capability of displaying colored images, and high quality image display.

One type of LCD device is the active matrix type LCD device in which a plurality of pixels are arranged in a matrix, and switching devices such as an independently controllable thin film transistor (TFT) are provided for each pixel in the matrix.

For example, one active matrix type LCD device utilized for a screen of a notebook, a television, a monitor or the like includes first and second substrates facing each other and a liquid crystal layer interposed therebetween. The first substrate or array substrate includes a plurality of gate lines and a plurality of data lines crossing each other to define a plurality of pixel regions. Further, a plurality of TFTs are disposed at the crossings of the plurality of gate lines and the plurality of data lines, wherein each of the plurality of TFTs corresponds to one of the plurality of pixel regions and is connected to each of a plurality of pixel electrodes formed in the respective one of the plurality of pixel regions.

In addition, the second substrate or color filter substrate includes: a black matrix overlapping with a non-pixel region of the first substrate such as a region occupied by a gate line, a data line, or a TFT; red, green and blue color filters repetitively arranged in an order in the plurality of pixel regions; and a common electrode disposed on the black matrix and the color filters.

The LCD panel is a non-emissive display device utilizing a light transmittance difference generated by an electric potential difference applied between the pixel electrode and the common electrode to generate images. Because a light source is required for viewing the generated images, LCD devices may further include a backlight unit. The LCD device can generate a multi color display by selectively combining red, green, and blue filtered light using a transmittance difference in each pixel and light emitted light from the backlight unit. The plurality of patterns such as the gate line, the data line, the pixel electrode and the common electrode, may be formed using a sequential process including depositing a thin film on a substrate; using a photolithographic process to form a photoresist layer for exposing a portion of the thin film; and employing an etching process to remove the exposed portion of the thin film.

An example photolithographic process includes coating a photoresist material on the substrate deposited the thin film; exposing a portion of the photoresist layer using a mask having a predetermined pattern; and developing for removal either the exposed portion or a non-exposed portion of the photoresist layer, thereby obtaining a photoresist pattern having the same shape as the predetermined pattern of the mask.

The demand for large-sized and high-resolution flat panel display devices have placed increased demands on the photolithographic process. In particular, the manufacture of large-sized and/or high-resolution devices requires that the exposing process be performed more accurately and precisely, and improvements in the exposure apparatus used in the exposing process are in high demand.

FIG. 1 is a schematic perspective view showing an exposure apparatus for a flat panel display device and a method of exposing according to the related art.

As shown in FIG. 1, an exposure apparatus 1 for a flat panel display device according to the related art includes a light source 10 for emitting ultraviolet rays or X-rays, a mask 20, and a stage 30 having a horizontal support surface 32 on which a substrate 2 is disposed. The mask 20 is horizontally arranged in correspondence with a surface of the stage 30. A thin film 4 is disposed on the substrate 2 and a photoresist layer 6 is disposed on the thin film 4. The mask 20 includes a transparent base substrate (not shown) of quartz and a pattern 24 made of an opaque material such as chromium (Cr) disposed on the transparent base substrate. Although not shown, a transmissive region and a shielded region are defined in the mask 20, and the pattern 24 is disposed in the shielded region. A portion of the transparent base substrate exposed by the pattern 24 is disposed in the transmissive region.

Hereinafter, an exposing process using the described related art exposure apparatus 1 will be explained.

The exposing process includes disposing the substrate 2 on the horizontal support surface 32 of the stage 30; horizontally arranging the mask 20 in correspondence with the substrate 2; and irradiating light from the light source onto the photoresist layer 6 on the substrate 2 through the mask 20 to transfer an image of the pattern 24 to the photoresist layer 6. Depending on the photosensitivity type of the photoresist layer 6, either the irradiated or the non-irradiated portion of the photoresist layer 6 is removed in a developing process. For example, when the photoresist layer 6 corresponds to a positive type, the irradiated portion of the photoresist layer 6 is removed during developing and the non-irradiated portion remains as a photoresist pattern (not shown). On the other hand, when the photoresist layer 6 corresponds to a negative type, the non-irradiated portion of the photoresist layer 6 is removed during developing leaving the irradiated portion of the photoresist layer 6 remaining as the photoresist pattern.

In the developing process, a developer is used to form the photoresist pattern. For example, when the photoresist layer 6 corresponds to a positive type in FIG. 1, the developer removes the irradiated portions of the photoresist layer 6, and the photoresist layer 6 is patterned into the photoresist pattern corresponding to the pattern 24 of the mask 20 exposing a portion of the thin film. The portion of the thin film (not shown) exposed by the photoresist pattern is removed in an etching process, thereby obtaining a desired thin film pattern.

The manufacture of a large-sized flat panel display device requires that the size of the mask 20 for the exposure apparatus 1 be correspondingly large-sized. However increasing the size of the mask 20 may create problems. First, when the mask 20 is large-sized, the weight of the mask 20 is correspondingly large. When a large sized mask 20 is horizontally arranged with respect to a surface of the substrate 2 in the exposing process, the center portion of the mask 20 may flex under its own weight in the direction of the force of gravity. The flexing of the mask 20 results in a distortion of the pattern transferred to the photoresist layer 6.

When using the exposure apparatus 1 of the related art the mask 20 is supported at its edges rather than at the center portion of the mask 20, which is in the main or transmissive region. Accordingly, flexing of large-sized masks results from the use of the related art exposure apparatus 1.

Further, the horizontal arrangement of the mask 20 facilitates the accumulation of unwanted particles on the surface of the mask 20. These particles may produce image defects. For example, a dot defect may occur when a particle present during the exposing process acts as an obstacle to transcribing a pattern to the photoresist.

This flexing phenomenon may be founded in the substrate having a size of about 1500·1850 mm and the mask having a size of about 1100·1300 mm for the substrate. The phenomenon may be aggravated as the sizes are increased.

FIG. 2 is a schematic cross sectional view taken along a line II-II of FIG. 1 illustrating flexure of a mask.

As shown in FIG. 2, the center of the mask 20 has a flexure portion at its center due to flexing of the mask 20 under its own weight and the surface of the mask 20 is covered with the particles 40.

Because the flexure of the mask 20 and the attachment of particles 40 to the mask 20 may be related to pattern distortion of the photoresist pattern and consequently the thin film pattern, it has been suggested that thickness of the mask 20 be increased and that the processing time be shortened. However, these suggestions lead to increased product cost.

Because the transparent base substrate of the mask 20 is selected from an expensive material such as quartz, increasing the thickness of the mask increases the product cost of the LCD device. Increasing the thickness of the mask also increases the weight of the mask, which may further contribute to flexure, so that the suggestion to increase the thickness of the mask may not effectively solve the identified problems. Further, additional problems may occur in the support unit supporting the mask 20 when the weight of the mask 20 increases.

Furthermore, as processing time is shortened, the probability of forming defects in the mask 20 increases. The time-shortened processes also have the disadvantage of being complicated and inefficient.

SUMMARY OF THE INVENTION

Accordingly, the present invention is directed to an exposure apparatus for flat panel display device and a method of exposing using the exposure apparatus that substantially obviates one or more of the problems due to limitations and disadvantages of the related art.

An advantage of the present invention is to provide an exposure apparatus that supports a mask in a vertical arrangement to prevent flexing of the mask under its own weight.

Another advantage of the present invention is to provide a method for exposing a flat panel display including arranging the mask to prevent the accumulation of particles thereby increasing the reliability of a photolithographic process.

Additional features and advantages of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the present invention, as embodied and broadly described herein, an exposure apparatus for a flat panel display device includes: a light source; a stage having a horizontal support surface for disposing a substrate thereupon; a mask vertically arranged with respect to the horizontal support surface; a frame surrounding an edge of the mask; and an optical system between the light source and the stage, the optical system for controlling a direction of light from the light source through the mask to irradiate the light onto the stage.

In another aspect of the invention, a method of exposing using an exposure apparatus for a flat panel display device includes: preparing an exposure apparatus including: a light source; a stage having a horizontal support surface for disposing a substrate thereupon; a mask vertically arranged with respect to the horizontal support surface of the stage, the mask including a transmissive region and a shielded region; a frame surrounding an edge of the mask; and an optical system between the light source and the stage, the optical system for controlling a direction of light from the light source through the mask to irradiate the light onto the stage; disposing the substrate on the stage, the substrate including a thin film and a photoresist layer on the thin film; and irradiating the light from the light source through the mask and via the optical system onto a portion of the photoresist layer on the substrate corresponding to the transmissive region.

In another aspect of the invention, a method for photolithography of a flat panel display device includes: sequentially forming a thin film and a photoresist layer on a substrate; preparing an exposure apparatus including: a light source; a stage having a horizontal support surface for disposing a substrate thereupon; a mask vertically arranged with respect to the horizontal support surface of the stage, the mask including a transmissive region and a shielded region; a frame surrounding an edge of the mask; and an optical system between the light source and the stage, the optical system for controlling a direction of light from the light source through the mask to irradiate the light onto the stage; disposing the substrate on the stage; irradiating the light from the light source through the mask and via the optical system onto a portion of the photoresist layer on the substrate corresponding to the transmissive region; and developing the exposed portion of the photoresist layer to form a photoresist pattern for exposing a portion of the thin film.

In another aspect of the invention, a method for fabricating a flat panel display device includes: forming a thin film on a substrate; forming a photoresist layer on the thin film; substantially vertically disposing a mask; irradiating light through the mask and onto a portion of the photoresist layer; and developing the exposed portion of the photoresist layer to form a photoresist pattern to expose a portion of the thin film wherein a shape of the photoresist pattern corresponds to an element of the flat panel display device, wherein the element includes one of a gate line, a data line, a pixel electrode and a common electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to embodiments of the present invention, examples of which are illustrated in the accompanying drawings.

Figure 1:
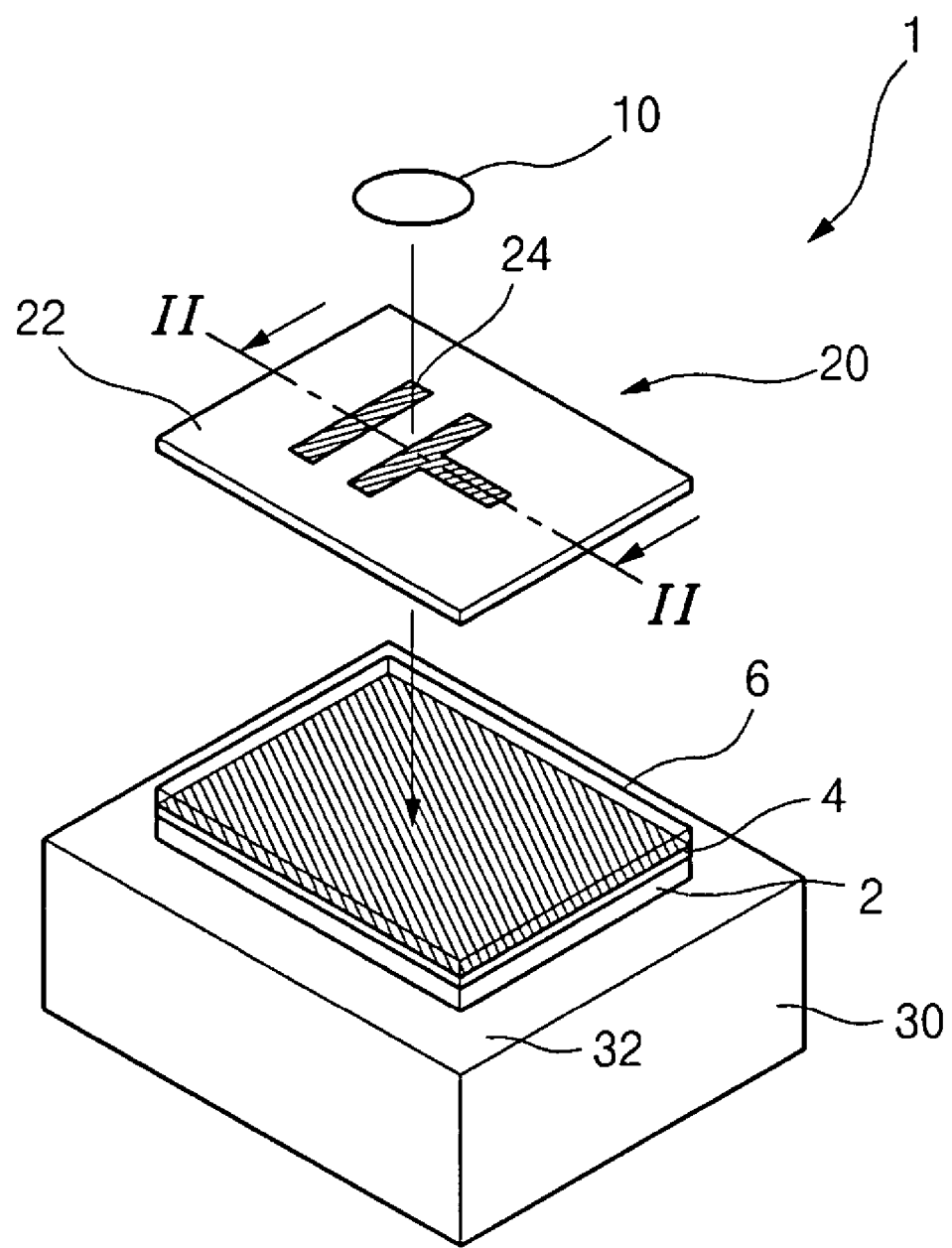
FIG. 1 is a schematic perspective view showing an exposure apparatus for a flat panel display device and a method of exposing according to the related art.
Figure 2:
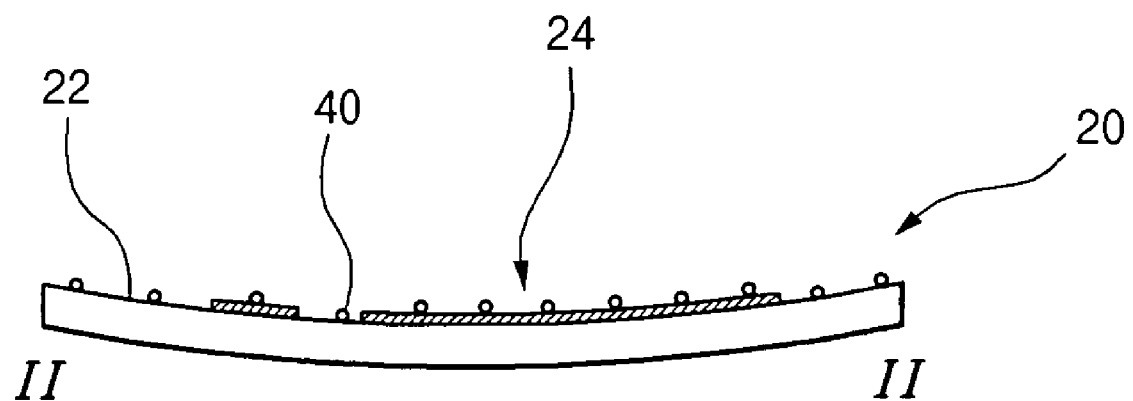
FIG. 2 is a schematic cross sectional view taken along a line II—II of FIG. 1 illustrating a flexure of the mask.
Figure 3:
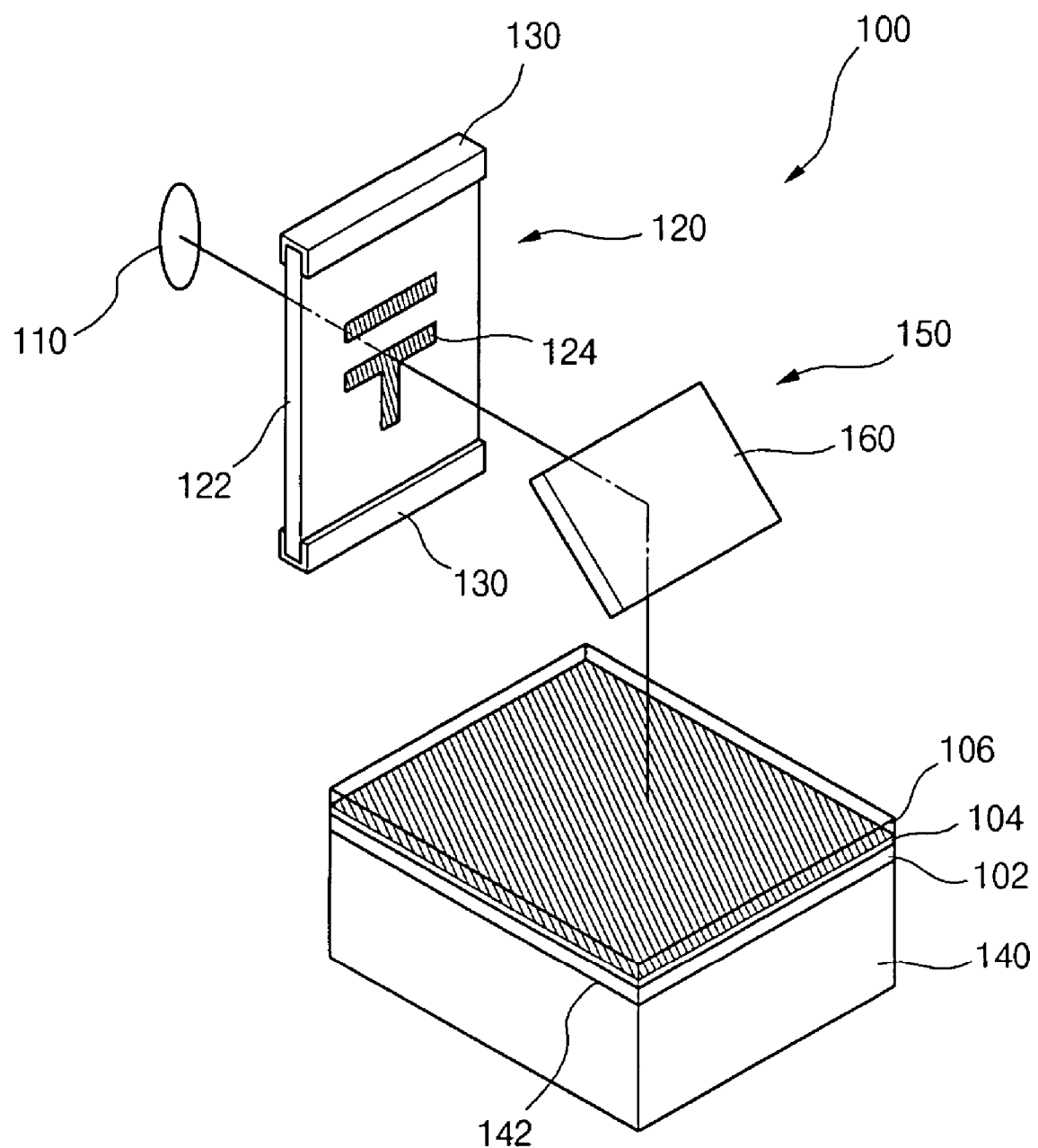
FIG. 3 is a schematic cross-sectional view showing an exposure apparatus for a flat panel display device and an exposing process using the exposure apparatus according to an embodiment of the present invention.

FIG. 3 is a schematic cross-sectional view showing an exposure apparatus for a flat panel display device and an exposing process using the exposure apparatus according to an embodiment of the present invention.

As shown in FIG. 3, an exposure apparatus 100 according to the present invention includes a stage 140 having a horizontal support surface 142 on which a substrate 102 is disposed, a mask 120 vertically arranged with respect to a horizontal support surface 142, a light source 110 irradiating light onto the substrate 102 through the mask 120, and an optical system 150 appropriately treating light from the light source 110 before the light is irradiated onto the substrate 102. The optical system 150 is disposed between the mask 120 and the substrate 102.

Specifically, the light source 110 emits light as an energy source for the exposing process. For example, an X-ray source or a laser source including one or more lasers may be provided as the light source 110.

The mask 120 is disposed within the path of the light emitted from the light source 110 and faces the light source 110. The mask 120 includes a transparent base substrate 122 and a pattern 124 on the transparent base substrate 122. For example, the transparent base substrate 122 includes a transparent material such as quartz and the pattern 124 includes an opaque material such as chromium (Cr). When the photoresist layer 106 corresponds to a positive type, for example, the pattern of the mask 120 is transferred to the substrate 102 to form a photoresist pattern (not shown).

The mask 120 includes a shielding region formed within the pattern 124 and a transmissive region formed on the transparent base substrate 122 excluding the area of the pattern 124. The mask 120 is vertically arranged with respect to the horizontal support surface 142 of the stage 140. Further, the exposure apparatus 100 includes a fixing member 130 supporting the mask 120 at the mask edges. For example, the mask 120 may be vertically arranged by a frame 130 that surrounds the top and bottom edges of the mask 120 to support the mask 120. Because the light source 110 and the mask 120 face each other, light from the light source 110 is horizontally irradiated above the substrate 102 through the mask 120.

The exposure apparatus 100 further includes an optical system 150 between the mask 120 and the substrate 102 for controlling the light irradiated through the mask 120. The optical system 150 includes a mirror unit 160 for changing or redirecting the path of the light. The mirror unit 160 may be selected from one of a front coated mirror called as a projection mirror or a cold light mirror that selectively transmits only specific wavelengths of light along with changing the course of the light.

The mirror unit 160 changes the path of the light passing horizontally through the mask 120, redirecting the light to travel in a vertical direction, for example downwards, towards the substrate 102. The exposure apparatus 100 may include an optical unit (not shown) that processes and treats light to be irradiated onto the substrate 102 after the light has been emitted from the light source 110 and redirected by the mirror unit 160.

The substrate 102 includes the thin film 104 and the photoresist layer 106 on the thin film 104. In the exposing process, the photoresist layer 106 is substantially exposed using the exposure apparatus 100.

During the exposing process using the exposure apparatus 100 the profile of the light from the light source 110 takes the shape of the pattern 124 of the mask by passing through the mask 120 and the path of the light after passing through the mask 120 is changed by the mirror unit 160 so that the light is irradiated onto the substrate 102 disposed on the horizontal support surface 142. Thus, by use of the exposure apparatus 100, light having a profile in the shape of the pattern 124 of the mask 120 is irradiated onto the substrate 102.

Consequently, the photoresist layer 106 has a first portion irradiated by the light and a second portion not irradiated by the light.

In a photolithographic process using a photoresist material, a photoresist material can be dissolved selectively by a developer after the molecular structure of the photoresist is altered by irradiated light. For example, the photoresist material may include a polymer comprising a chemical compound of a solvent and a monomer, and a sensitizer material. The sensitizer material renders portions of the photoresist material soluble or insoluble by the developer after energy in the form of light has irradiated onto the polymer.

Further, the photoresist material may be a positive type or a negative type depending on the sensitizer material used in the photoresist material. A positive type photoresist reacts to irradiated light by becoming soluble and thus the irradiated portion of the photoresist is removed by developer leaving the non-irradiated portion of the photoresist remaining as a pattern. For a negative type photoresist, the irradiated portion becomes insoluble in the developer and remains as a pattern after treatment with the developer while the non-irradiated portion is removed by the developer. For example, when the photoresist layer 124 is of the positive type, the photoresist layer 124 is patterned into a photoresist pattern corresponding to the shielded or opaque regions of the mask 120.

The above described apparatus may be used in a process to fabricate a flat panel display device such as a liquid crystal display device by performing steps including: forming a thin film on a substrate; forming a photoresist layer on the thin film; substantially vertically disposing a mask irradiating light through the mask and onto a portion of the photoresist layer; and developing the exposed portion of the photoresist layer to form a photoresist pattern to expose a portion of the thin film wherein a shape of the photoresist pattern corresponds to elements of the flat panel display device. The process may be repeated to form multiple elements or sets of elements of a flat panel display device such as gate lines, data lines, pixel electrodes, common electrodes, and TFT elements such as source, drain, and gate electrodes.

Figure 4:
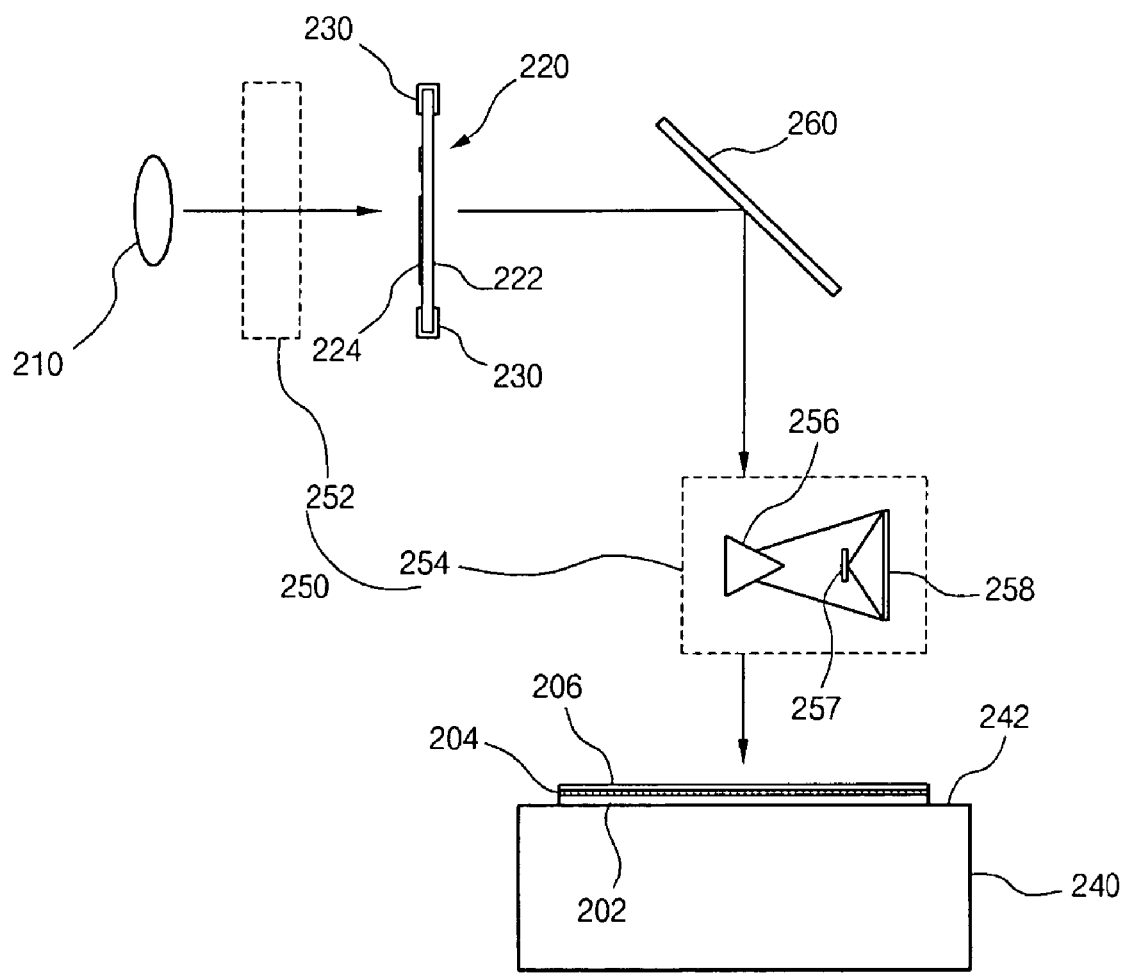
FIG. 4 is a schematic side view showing an exposure apparatus for a flat panel display device and an exposing process according to an embodiment of the present invention.

FIG. 4 is a schematic side view showing an exposure apparatus for a flat panel display device and an exposing process according to an embodiment of the present invention.

As shown in FIG. 4, an optical system 250 according the present invention includes a condenser lens 252 unit for concentrating light between a light source 210 and the mask 220, and an objective lens unit 254 between the mask 220 and substrate 202. The objective lens unit 254 may be disposed between the mask 220 and the mirror unit 260 or between the mirror unit 260 and the substrate 202 as shown in FIG. 4. Further, the objective lens unit 254 may include at least one prism 256 and a plurality of lenses 257 and 258.

The condenser lens unit 252 and the objective lens unit 254 function to correct the path and phase difference of light emitted by the light source 210 so that the pattern 224 of the mask 220 is accurately transferred to the photoresist layer 206 by the irradiated light. The specific structure and arrangement of the condenser lens unit 252 and the objective lens unit 254 may vary as required to accomplish this function.

Figure 5:
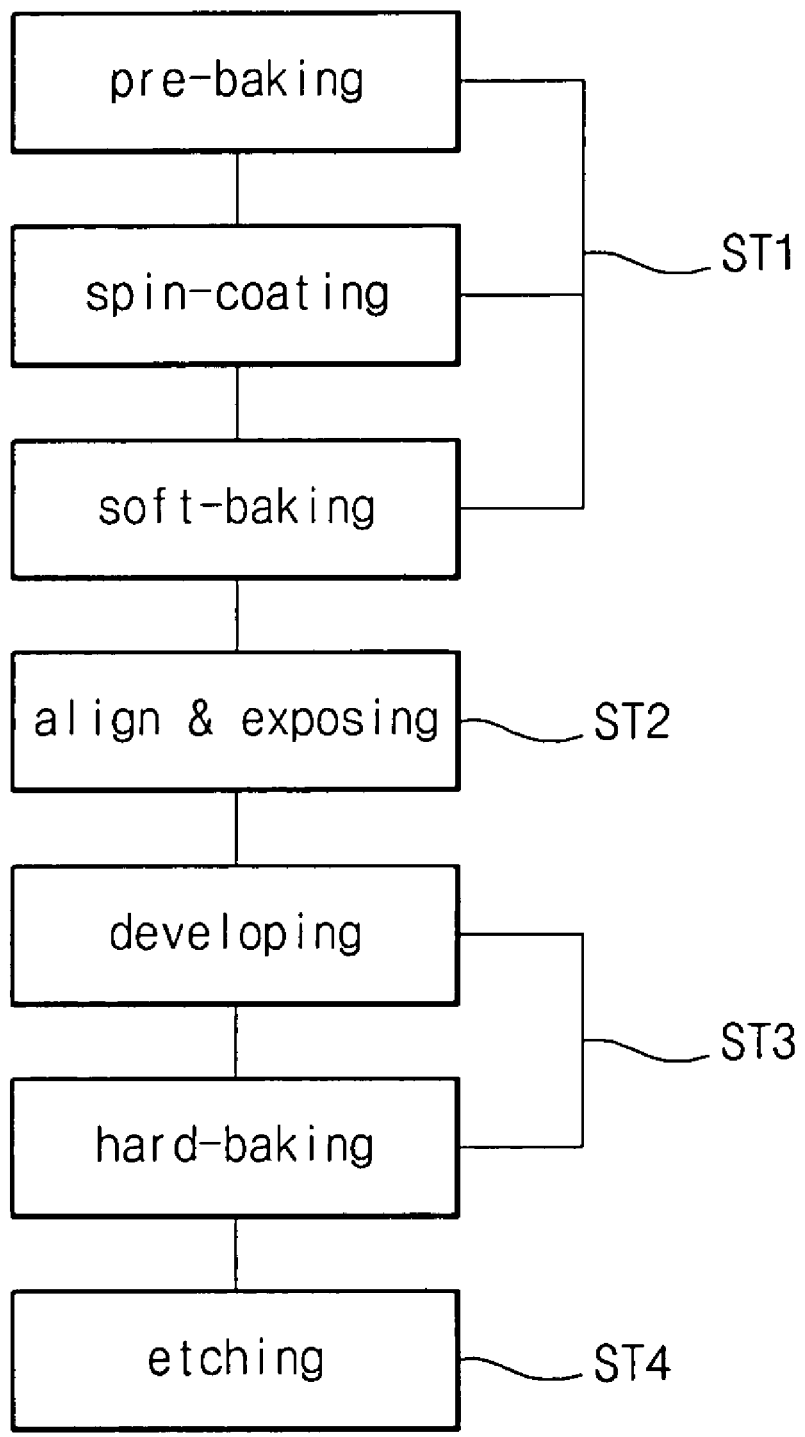
FIG. 5 is a schematic flow chart showing a photolithography process for a flat panel display device according to an embodiment of the present invention.

FIG. 5 is a schematic flow chart showing a photolithography process for a flat panel display device according to an embodiment of the present invention.

Hereinafter, a photolithographic process for a flat panel display device according to an embodiment of the present invention, will be described with reference to FIG. 5. Reference will also be made to FIG. 3 in explaining the exposure apparatus and an exposing process using the exposure apparatus.

Step ST1 includes coating a photoresist layer with a uniform thickness onto a thin film disposed on a substrate through pre-baking, spin-coating and soft-baking processes.

Specifically, the pre-baking process corresponds to a process for improving the adhesive strength between the photoresist layer 106 and the thin film 104 by removing residual moisture on the thin film 104 disposed on the substrate 102 before forming the photoresist layer 106. The spin coating process corresponds to a process for coating the photoresist layer 106 to a uniform thickness by spinning the substrate 102 at a high speed after dropping a photoresist material solution onto the substrate 102. The soft-baking process corresponds to a process for weakly curing the photoresist layer 106 by evaporating a volatile component such as solvent from the photoresist material.

Next, step ST2 includes aligning the substrate 102 and the mask 120 and exposing the substrate 102, wherein the substrate 102 after being weakly cured in the soft-baking step is disposed on a horizontal support surface 142 of a stage 140 and the mask 120 is accurately arranged and supported using the frame 130. Accurately arranging and supporting the mask 120 includes supporting the mask substantially vertically to substantially eliminate sagging 120 of the mask under its own weight, and arranging the mask 120 horizontally to align with the substrate 102.

Step ST3 includes developing and hard-baking. During developing, a portion of the photoresist layer 106 is selectively removed using a predetermined developer. The developer removes portions of the photoresist layer 106 based on property differences between exposed (irradiated) and non-exposed (non-irradiated) portions of the photoresist layer 106. The developing process patterns the photoresist layer 106 into a photoresist pattern such as a pattern corresponding to the pattern 124 of the mask 120.

Next, hard-baking is performed by heating the entire surface of the substrate 102 to a predetermined temperature. Hard-baking increases the adhesive strength of the photoresist pattern.

Finally, in step ST4, a portion of the thin film 104 that is exposed by the photoresist layer 106 is etched and a desired thin film pattern is obtained by stripping the residual photoresist material and cleaning the substrate 102 including the thin film pattern.

As explained above, using the exposure apparatus 100 of the present invention allows vertically arranging the mask 120 with respect to the surface of the substrate 102. The vertical arrangement of the mask 120 eliminates a flexure phenomenon associated with large sized masks 120 and prevents the mask 102 from flexing or sagging under its own weight.

In other words, the exposure apparatus 100 can prevent a structural change of the mask 120 due to flexing of the mask 120 under its own weight by vertically arranging the mask 120 using the frame 130 as a supporting member for the mask 120. Accordingly, the product cost of the mask 120 is reduced because flexing of the mask is eliminated without increasing the thickness of the mask 120. Preventing the change to the structure of the mask 120 also results in more accurate pattern transfer to the photoresist material.

Furthermore, by vertically arranging the mask 120, the accumulation of particles on the surface of the mask 120 is effectively reduced, thereby reducing the occurrence of image defects due to the particles.

It will be apparent to those skilled in the art that various modifications and variations may be made in the present invention without departing from the spirit or scope of the invention. Thus, it is intended that the present invention cover the modifications and variations of this invention provided they come within the scope of the appended claims and their equivalents.

What is claimed is:

1. An exposure apparatus for a flat panel display device, comprising:
   a light source;
   a stage having a horizontal support surface for disposing a substrate thereupon;
   a mask vertically arranged with respect to the horizontal support surface and including a front surface, a rear surface and first to fourth side surfaces, wherein the first and second side surfaces horizontally face each other and the third and fourth side surfaces vertically face each other;
   a frame covering top and bottom edges of the front and rear surfaces of the mask, such that the first side surface between the top edge of the front surface and the top edge of the rear surface, and the second side surface, which is opposite to the first side surface, between the bottom edge of the front surface and the bottom edge of the rear surface are covered, and such that side edges of the front and rear surfaces and the third and fourth side surfaces of the mask are exposed; and
   an optical system between the light source and the stage and including an objective lens unit, which includes one prism and at least two lenses, the optical system for controlling a direction of light from the light source through the mask to irradiate the light onto the stage.

2. The apparatus according to claim 1, wherein a thin film is disposed on the substrate and a photoresist layer is disposed on the thin film.

3. The apparatus according to claim 1, wherein the optical system includes a mirror unit.

4. The apparatus according to claim 3, wherein the mirror unit is one of a front coated mirror and a cold light mirror.

5. The apparatus according to claim 3, wherein the optical system includes
a condenser lens unit disposed between the light source and the mask,
wherein the objective lens unit is disposed at one of a position between the mask and the mirror unit, and a position between the mirror unit and the substrate.

6. The apparatus according to claim 1, wherein the mask includes a base substrate of quartz and a pattern of an opaque material on the base substrate.

7. The apparatus according to claim 6, wherein the mask includes a shielded region corresponding to the pattern and a transmissive region corresponding to a portion of the base substrate exclusive of the pattern.

8. A method of exposing using an exposure apparatus for a flat panel display device, comprising:
preparing an exposure apparatus including:
a light source;
a stage having a horizontal support surface for disposing a substrate thereupon;
a mask vertically arranged with respect to the horizontal support surface of the stage, the mask including a transmissive region and a shielded region, the mask including a front surface, a rear surface and first to fourth side surfaces, wherein the first and second side surfaces horizontally face each other and the third and fourth side surfaces vertically face each other;
a frame covering top and bottom edges of the front and rear surfaces of the mask, such that the first side surface between the top edge of the front surface and the top edge of the rear surface, and the second side surface, which is opposite to the first side surface, between the bottom edge of the front surface and the bottom edge of the rear surface are covered and, such that side edges of the front and rear surfaces and the third and fourth side surfaces of the mask are exposed; and
an optical system between the light source and the stage and including an objective lens unit, which includes one prism and at least two lenses, the optical system that controls a direction of light from the light source through the mask to irradiate the light onto the stage;
disposing the substrate on the stage, the substrate including a thin film and a photoresist layer on the thin film; and
irradiating the light from the light source through the mask and via the optical system onto a portion of the photoresist layer on the substrate corresponding to the transmissive region.

9. The method according to claim 8, wherein the optical system includes a mirror unit.

10. The method according to claim 9, wherein the mirror unit is one of a front coated mirror and a cold light mirror.

11. The method according to claim 9, wherein the optical system includes
a condenser lens unit disposed between the light source and the mask,
wherein the objective lens unit is disposed at one of a position between the mask and the mirror unit, and a position between the mirror unit and the substrate.

12. A method for photolithography of a flat panel display device, comprising:
sequentially forming a thin film and a photoresist layer on a substrate;
preparing an exposure apparatus including:
a light source;
a stage having a horizontal support surface for disposing a substrate thereupon;
a mask vertically arranged with respect to the horizontal support surface of the stage, the mask including a transmissive region and a shielded region, the mask including a front surface, a rear surface and first to fourth side surfaces, wherein the first and second side surfaces horizontally face each other and the third and fourth side surfaces vertically face each other;
a frame covering top and bottom edges of the front and rear surfaces of the mask, such that the first side surface between the top edge of the front surface and the top edge of the rear surface, and the second side surface, which is opposite to the first side surface, between the bottom edge of the front surface and the bottom edge of the rear surface are covered, and such that side edges of the front and rear surfaces and the third and fourth side surfaces of the mask are exposed; and
an optical system between the light source and the stage and including an objective lens unit, which includes one prism and at least two lenses, the optical system that controls a direction of light from the light source through the mask to irradiate the light onto the stage;
disposing the substrate on the stage;
irradiating the light from the light source through the mask and via the optical system onto a portion of the photoresist layer on the substrate corresponding to the transmissive region; and
developing the exposed portion of the photoresist layer to form a photoresist pattern to expose a portion of the thin film.

13. The method according to claim 12 further including:
patterning the thin film by etching a portion of the thin-film exposed by developing.

* * * * *